US008598961B2

United States Patent
Hasselblad et al.

(10) Patent No.: US 8,598,961 B2
(45) Date of Patent: Dec. 3, 2013

(54) WAVEGUIDE TRANSITION FOR CONNECTING U-SHAPED SURFACE MOUNTED WAVEGUIDE PARTS THROUGH A DIELECTRIC CARRIER

(75) Inventors: Marcus Karl Hasselblad, Mölndal (SE); Per Ligander, Göteborg (SE); Simone Bastioli, Spoleto (IT); Uwe Rosenberg, Backnang (DE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 379 days.

(21) Appl. No.: 12/988,309

(22) PCT Filed: Apr. 16, 2008

(86) PCT No.: PCT/SE2008/050427
§ 371 (c)(1),
(2), (4) Date: Oct. 15, 2010

(87) PCT Pub. No.: WO2009/128752
PCT Pub. Date: Oct. 22, 2009

(65) Prior Publication Data
US 2011/0037531 A1 Feb. 17, 2011

(51) Int. Cl.
*H01P 5/02* (2006.01)
*H01P 3/12* (2006.01)

(52) U.S. Cl.
USPC .............................. 333/21 R; 333/34; 333/249

(58) Field of Classification Search
USPC ........... 333/21 R, 26, 34, 208, 230, 239, 248, 333/249, 250
See application file for complete search history.

(56) References Cited

U.S. PATENT DOCUMENTS

| | | | |
|---|---|---|---|
| 6,498,550 B1 * | 12/2002 | Miller et al. | 333/208 |
| 6,614,332 B2 * | 9/2003 | Yamashita et al. | 333/239 |
| 6,788,918 B2 * | 9/2004 | Saitoh et al. | 455/81 |
| 2004/0227597 A1 * | 11/2004 | Chang et al. | 333/249 |

FOREIGN PATENT DOCUMENTS

| | | |
|---|---|---|
| EP | 0 959 515 A1 | 11/1999 |
| EP | 1 592 082 A1 | 11/2005 |
| JP | 2005-102024 A | 4/2005 |

OTHER PUBLICATIONS

Muller, T. Surface-Mountable Metalized Plastic Waveguide Filter Suitable for High Volume Production. Microwave Conference, 2003. Piscataway, NJ, US. IEEE vol. 3, Oct. 7, 2003.

* cited by examiner

*Primary Examiner* — Benny Lee

(57) ABSTRACT

The present invention relates to a transition arrangement comprising two surface-mountable waveguide parts and a dielectric carrier material with a metallization and a ground plane provided on a respective first main side and second main side Surface-mountable waveguide parts comprise a first wall, a second wall, and a third wall, which second and third walls are arranged to contact a part of the metallization, all the walls together essentially forming a U-shape, the surface-mountable waveguide parts also comprising respective bend parts. The metallization on the first main side is removed such that a first aperture and a second aperture are formed, the apertures being enclosed by a frame of via holes electrically connecting the ground plane with the metallization, the bend parts being fitted such that the apertures permit passage of a microwave signal propagating via the bend parts. Then the dielectric carrier material itself acts as a waveguide transition between the first aperture and the second aperture.

5 Claims, 4 Drawing Sheets section A-A

WAVEGUIDE TRANSITION FOR CONNECTING U-SHAPED SURFACE MOUNTED WAVEGUIDE PARTS THROUGH A DIELECTRIC CARRIER

TECHNICAL FIELD

The present invention relates to a transition arrangement comprising a first surface-mountable waveguide part, a second surface-mountable waveguide part and a dielectric carrier material with a metallization provided on a first main side, the first surface-mountable waveguide part comprising a first wall, a second wall, and a third wall, which second and third walls are arranged to contact a part of the metallization, all the walls together essentially forming a U-shape. The second surface-mountable waveguide part comprises a first wall, a second wall and a third wall, which second and third walls are arranged to contact a part of the metallization, all the walls together essentially forming a U-shape, the dielectric carrier material further comprising a second main side with a ground plane. The first surface-mountable waveguide part also comprises a first bend part having a first end and the second surface-mountable waveguide part comprises a second bend part having a second end, where the ends face each other when the surface-mountable waveguide parts are mounted.

BACKGROUND OF THE INVENTION

When designing microwave circuits, transmission lines and waveguides are commonly used. A transmission line is normally formed on a dielectric carrier material. Due to losses in the dielectric carrier material, it is sometimes not possible to use any transmission lines. When there, for example, is a diplexer in the layout, the diplexer may have to be realized in waveguide technology. Waveguides are normally filled with air or other low-loss materials.

Waveguide diplexers used today are large mechanical components screwed into a mechanical cabinet and connected to different parts such as for example, an antenna via some type of waveguide flange. It is desirable to mount such a diplexer structure on a dielectric carrier material to form a surface-mounted waveguide structure.

Such a surface-mounted waveguide is normally made having three walls and one open side. Metallization is then provided on the side of the dielectric carrier material facing the waveguide, where the metallization serves as the remaining wall of the waveguide, thus closing the waveguide structure when the waveguide is fitted to the dielectric carrier material.

An example of surface-mountable waveguides is disclosed in the paper "Surface-mountable metalized plastic waveguide filter suitable for high volume production" by Thomas J Müller, Wilfried Grabherr, and Bernd Adelseck, 33$^{rd}$ European Microwave Conference, Munich 2003. Here, a surface-mountable waveguide is arranged to be mounted on a so-called footprint on a circuit board. A microstrip conductor to waveguide transition is disclosed, where the end of the microstrip conductor acts as a probe for feeding the waveguide's opening.

Surface mounting of large mechanical components, such as diplexers, may result in mechanical stress problems due to different coefficients of thermal expansion, CTE, of the materials involved, such as, for example, so-called twist and bow. Furthermore, such a large surface-mounted structure as a diplexer is too large to handle in an automated production line.

One way to solve this problem is to split the diplexer into a number of smaller parts. These parts have to be sufficiently connected to each other in order to present a proper electrical function. This problem is apparent for all large surface-mounted waveguide structures.

An example of a solution according to prior art is disclosed in prior art FIG. 1, showing a simplified cross-sectional side-view. A first surface-mounted waveguide part P1 and a second surface-mounted waveguide part P2 are mounted on a dielectric carrier material P3. The ends of these surface-mounted waveguide parts that face each other comprise respective 90° bend parts P4, P5, changing the direction of the transmitted signals 90° such that they are directed through corresponding openings P6, P7 in the dielectric carrier material P3. On the other side of the dielectric carrier material, a third surface-mounted waveguide part P8 is mounted, the third surface-mounted waveguide part comprising two 90° bend parts P9, P10 positioned such that the signal directed through the openings P6, P7 is guided through the third surface-mounted waveguide P8 part in such a way that it functions as a link between the first surface-mounted waveguide part P1 and the second surface-mounted waveguide part P2. The details of the bend parts P4, P5; P9, P10 are not shown in FIG. 1, only the function is schematically indicated.

This solution is, however, rather complicated and requires that a special waveguide part, having two 90° bend parts, is mounted on the other side of the dielectric carrier material, and that all waveguide parts are aligned with the openings such that there is no interruption in the transmission of the signals.

Placing the waveguide parts as close to each other as possible always results in a small gap anyway, which limits the performance regarding losses and spurious signal components due to leakage of microwave radiation and mismatch.

SUMMARY OF THE INVENTION

The object of the present invention is to provide a waveguide transition arrangement between different surface-mounted waveguide structure parts which are to be sufficiently electrically connected to each other in order to present a proper electrical function.

This problem is solved by means of a waveguide arrangement as mentioned initially. Furthermore, the metallization on the first main side is removed such that a first aperture and a second aperture are formed, the apertures being enclosed by a frame of via holes, the via holes electrically connecting the ground plane with the metallization on the first main side The first bend part is fitted such that the first aperture permits passage of a microwave signal propagating via the first bend part and the second bend part is fitted such that the second aperture permits passage of a microwave signal propagating via the second bend part, such that the dielectric carrier material itself acts as a waveguide transition between the first aperture and the second aperture.

According to a preferred embodiment, the first bend part and the second bend part are 90° bend parts, being arranged to direct a microwave signal propagating longitudinally along the respective surface-mountable waveguide part towards the dielectric carrier material when the surface-mountable waveguide parts are mounted.

According to another preferred embodiment, the first bend part and the second bend part each comprise a matching structure in the form of a corresponding transformer section.

For example, each transformer section comprises at least one step of decreased height where the respective first walls are arranged to be positioned closer to the dielectric carrier material.

Other preferred embodiments are evident from the description as set forth below.

A number of advantages are provided by the present invention. For example:
- the transition is simple and of low cost;
- a connection of two or more surface-mounted waveguide parts is achieved without disturbance of the waveguide mode of a propagating signal;
- a connection of two or more surface-mounted waveguide parts is achieved on one side of a dielectric carrier material;
- two surface-mounted waveguide parts are connected in a low-loss manner;
- two surface-mounted waveguide parts are connected in a flexible manner, providing a relaxed relation between the waveguide parts due to the ductile behavior of the sealing frame;
- the present invention can be assembled using a pick-and-place machine; and
- two surface-mounted waveguide parts are connected using no extra area on the dielectric material on which they are mounted.

BRIEF DESCRIPTION OF THE DRAWINGS

The present invention will now be described more in detail with reference to the appended drawings, where like features in the different drawing figures are designated by the same reference labels, and.

DETAILED DESCRIPTION OF THE INVENTION

Figure 1:
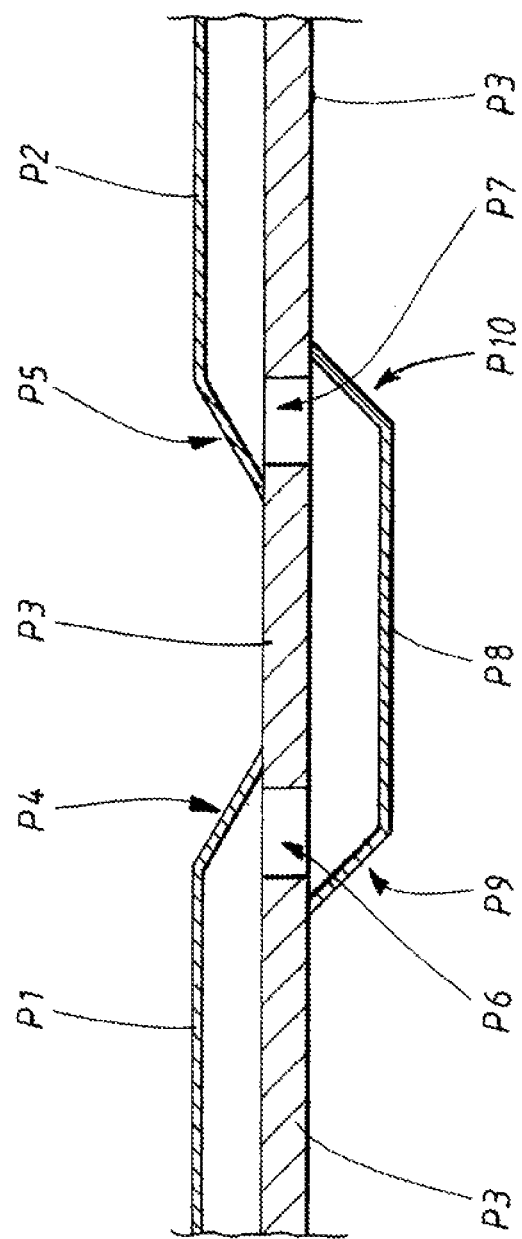
FIG. 1 is a sectional side-view of a prior art configuration.
Figure 2A:
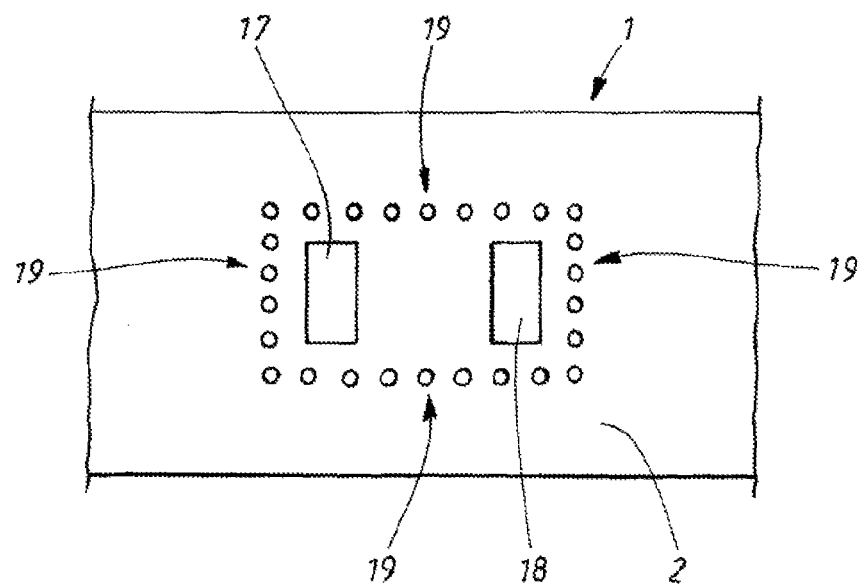
FIG. 2a is a top view of a dielectric carrier material.
Figure 2B:
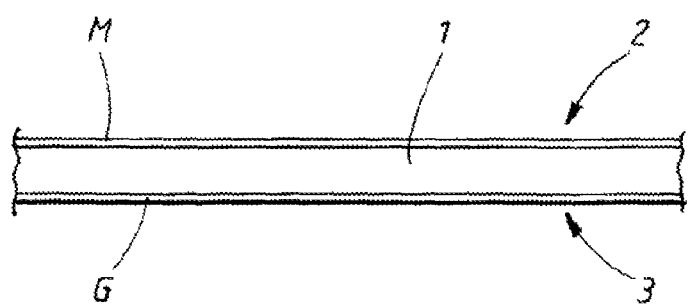
FIG. 2b is a side view of a dielectric carrier material.

In FIG. 2a and FIG. 2b, a respective top view and side view of a dielectric carrier material 1 used in a first embodiment example of the present invention is shown. The dielectric carrier material 1 has a first main side 2 and a second main side 3 (see FIG. 2b), originally having a metallic cladding on both sides. The metallic cladding is typically comprised of a layer of copper, which optionally is covered with thin layers of other metals to enhance the electrical, mechanical, and chemical properties of the cladding. The metallic cladding constitutes a metallization.

As shown in FIG. 2b, the metallization on the second main side 3 is used as a ground plane G, and the metallization M on the first main side 2 is etched away to such an extent that desired metal patterns are formed on the first main side 2.

Figure 3A:
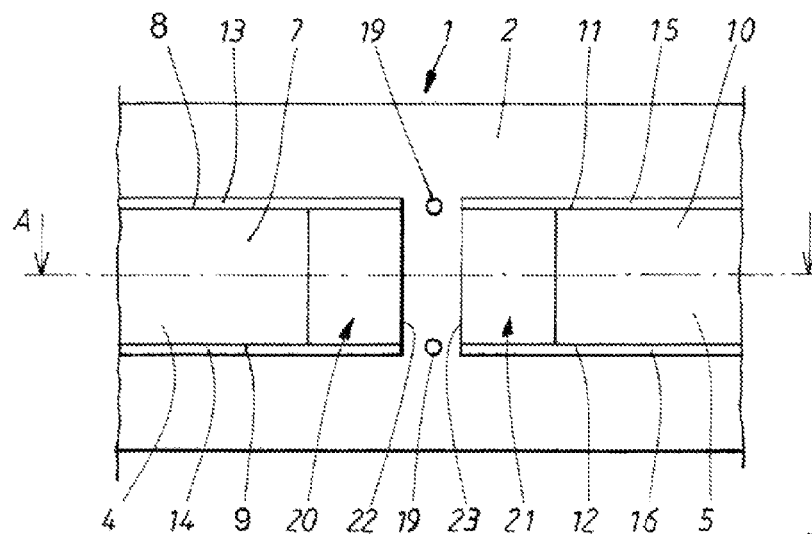
FIG. 3a is a top view of two surface-mounted waveguide parts.
Figure 3B:
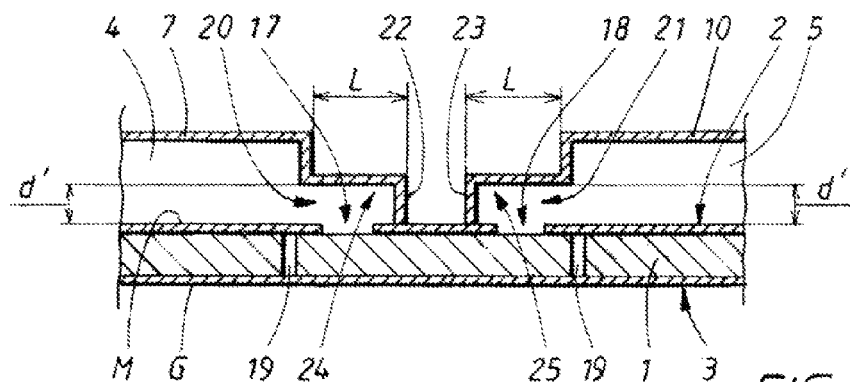
FIG. 3b is a sectional side view of two surface-mounted waveguide parts.

With reference to FIG. 3a and FIG. 3b, showing a top view and a cross-sectional side view (along section A-A of FIG. 3a), respectively, a first surface-mounted waveguide part 4 and a second surface-mounted waveguide part 5 are mounted on the metallization M (see FIG. 3b) on the first main side 2.

Each waveguide part 4, 5 has three respective walls 7, 8, 9 (for the first waveguide part 4); 10, 11, 12 (for the second waveguide part 5) and one open side S (shown only in FIG. 4), arranged to face the dielectric material 1. A part of the metallization M provided on the side of the dielectric carrier material 1 facing the waveguide parts 4, 5 serves as the remaining wall of the waveguide parts 4, 5, thus closing the waveguide part 4, 5 when mounted as shown in FIG. 3b.

Figure 4:
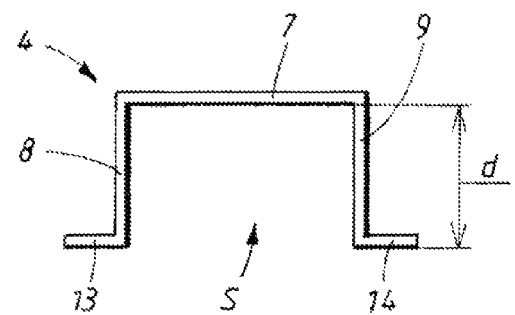
FIG. 4 is a simplified end view of a surface-mountable waveguide part.

Regarding the first waveguide part 4, also with reference to FIG. 4, showing a simplified open end view of the first waveguide part, a first wall 7 is arranged to be parallel to the dielectric carrier material 1 (see FIG. 3b) when the first waveguide part 4 is mounted, and then held at a certain distance d from the material by means of a second wall 8 and third wall 9, which second and third walls 8, 9 are arranged to contact a part of the metallization M on the first main side 2, all the walls 7, 8, 9 together essentially forming a U-shape when regarding the first waveguide part 4 from its short end. The second waveguide part 5 has the same configuration of its walls 10, 11, 12.

The waveguide parts 4, 5 are mounted in a known way, each having a longitudinally extending flange part 13, 14 (see FIGS. 3a, 4); 15, 16 (see FIG. 3a) comprised in each of the second walls 8, 11 and third walls 9, 12, the flanges 13, 14; 15, 16 being arranged to be the parts of these walls 8, 9, 11, 12 which contact the part of the metallization M on the first main side 2 when the waveguide parts 4, 5 are mounted, the part of the metallization M constituting a so-called footprint. The flanges 13, 14; 15, 16 are soldered, or glued by means of electrically conducting glue, to the footprint on the dielectric material's first main side 2. In this particular application, there may not be any need for a particular footprint, but some kind of guidance for the mounting of the surface-mountable waveguide parts is preferred.

According to the present invention, with reference to FIG. 2a, FIG. 2b, FIG. 3a and FIG. 3b, the metallization M on the first main side 2 is removed such that a first aperture 17 and a second aperture 18 are formed (see FIGS. 2a, 3b), the apertures 17, 18 being enclosed by a frame of via holes 19 (see FIGS. 2a, 3a, 3b). The via holes 19, being internally metalized, electrically connect the ground plane G (see FIGS. 2b, 3b) with the metallization M on the first main side 2 in a known manner, forming a wall of via holes 19, enclosing the apertures 17, 18 (see FIG. 3b).

As shown in FIGS. 3a and 3b, where the first waveguide part 4 and the second waveguide part 5 are mounted, the waveguide parts 4, 5 each comprise a respective first 90° bend part 20 and second 90° bend part 21 (not shown in FIG. 4), each bend part 20, 21 having a respective first end 22 and second end 23 in the longitudinal direction of the respective waveguide part 4, 5. The waveguide parts 4, 5 are mounted such that the ends 22, 23 of the 90° bend parts 20, 21 face each other.

When the first waveguide part 4 and the second waveguide part 5 are mounted, the first 90° bend part 20 and the second 90° bend part 21 are arranged to direct a microwave signal propagating longitudinally along the respective waveguide part 4, 5 towards the dielectric carrier material 1. Then, the first 90° bend part 20 is fitted such that the first aperture 17 permits passage of a microwave signal propagating via the first 90° bend part 20. In the same way, the second 90° bend part 21 is fitted such that the second aperture 18 permits passage of a microwave signal propagating via the second 90° bend part 21.

In this way, a microwave signal that is guided from the first waveguide part 4 to the second waveguide part 5 is led via the first 90° bend part 20, the first aperture 17, the second aperture 18 and the second 90° bend part 21, where the microwave signal is guided via the dielectric carrier material 1 between the first aperture 17 and the second aperture 18.

Thus, the dielectric carrier material 1 itself acts as a waveguide transitional part between the first aperture 17 and the second aperture 18, channeling a microwave signal. This is made possible by means of:
- the first aperture 17 and the second aperture 18, which allow a microwave signal to penetrate the dielectric carrier material 1; and
- the frame of via holes 19, which frame 19, together with the ground plane G and metallization M on the first main side 2, defines a volume in the dielectric carrier material 1 where the microwave signal is allowed to propagate.

The frame of via holes 19 thus forms a boundary in the dielectric carrier material 1.

Preferably, the first 90° bend part 20 and the second 90° bend part 21 each comprise a matching structure in the form of a corresponding transformer section 24, 25, as shown in FIG. 3b. The transformer sections 24, 25 can have any suitable shape that provides sufficient matching, one such shape is shown in FIG. 3b, where the height of the waveguide parts 4, 5 is decreased at the respective 90° bend part 20, 21.

More in detail, regarding the first waveguide part 4, a part of the first wall 7 is arranged to be positioned closer to the dielectric carrier material 1 when the first waveguide part 4 is mounted, by decreasing the height of the second wall 8 and the third wall 9 such that a certain distance d (see FIG. 4) is decreased to a lesser value d' (see FIG. 3b). The height of the first waveguide part 4 is decreased at the first 90° bend part 20, such that the decrease of height takes place during a certain distance L (see FIG. 3b) from the end 22 of the first 90° bend part.

The second waveguide part 5 has a similar configuration.

An example of another shape of the respective transformer section is a stepped structure, having a plurality of steps. The shapes described are commonly known for waveguide bend parts in general.

The present invention is not limited to the embodiment examples according to the above, but may vary freely within the scope of the appended claims.

For example, the metal used may be any suitable conducting material, for example copper, silver, or gold. The metallic claddings may be deposited onto the dielectric material by various methods, for example printing, plating, or rolling. There may also be several layers of metallic material, for example a layer comprising solder.

The dielectric material may comprise several layers if necessary, the layers comprising different types of circuitry. Such a layered structure may also be necessary for mechanical reasons.

The flanges may be of any suitable form, generally forming flange parts.

Figure 5:
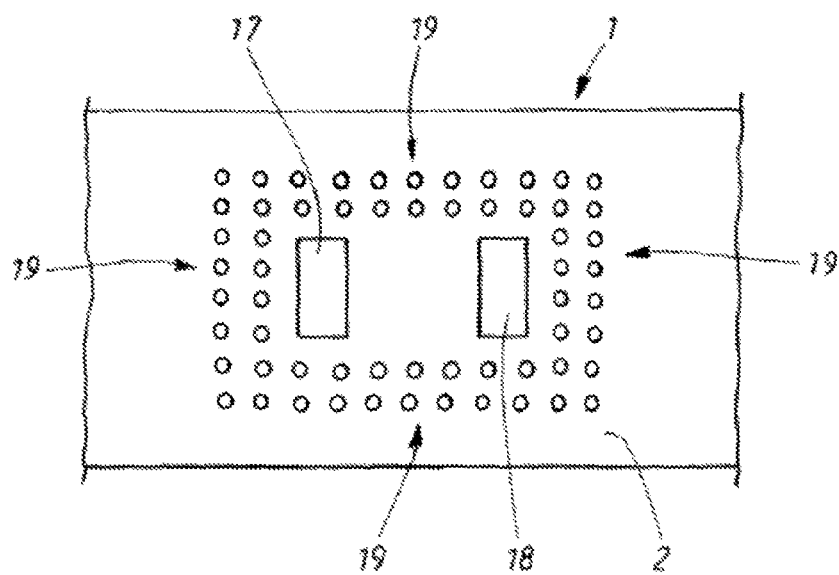
FIG. 5 is a top view of dielectric carrier material, according to an alternative embodiment.

The via hole frame 19 is shown as being comprised of a single row of via holes as shown in FIG. 2a. In order to further increase leakage suppression, more than one row of via holes may be used, the frame 19 then comprising at least two adjacent rows of via holes around its circumference, as shown in FIG. 5.

The waveguide parts may also be made in a non-conducting material, such as plastic, which is covered by a thin layer of metallization.

The invention claimed is:

1. A waveguide transition arrangement in a microwave circuit comprising:
a first surface-mounted waveguide part, a second surface-mounted waveguide part and a dielectric carrier material with a metallization provided on a first main side,
the first surface-mounted waveguide part comprising a first wall, a second wall, and a third wall, the second and third walls each having a flange part arranged to be surface mounted to a part of the metallization, the first, second and third walls of the first surface-mounted waveguide part together essentially forming a U-shape,
the second surface-mounted waveguide part comprising a first wall, a second wall and a third wall, the second and third walls each having a flange part arranged to be surface mounted to a part of the metallization, the first, second and third walls of the second surface-mounted waveguide part together essentially forming a U-shape, the dielectric carrier material further comprising a second main side with a ground plane, the first surface-mounted waveguide part comprising a first bend part having a first end and the second surface-mounted waveguide part also comprising a second bend part having a second end, where the first and second ends face each other when the first and second surface-mounted waveguide parts are mounted, wherein
the metallization on the first main side is removed such that a first aperture and a second aperture are formed with respect to the first surface-mounted waveguide part and the second surface-mounted waveguide part, respectively, the first and second apertures being enclosed by a frame of via holes, the via holes electrically connecting the ground plane with the metallization on the first main side, the first bend part being fitted such that the first aperture permits passage of a microwave signal propagating via the first bend part and the second bend part being fitted such that the second aperture permits passage of a microwave signal propagating via the second bend part, such that the dielectric carrier material itself acts as a waveguide transition between the first aperture and the second aperture.

2. The waveguide transition arrangement according to claim 1, wherein the first bend part and the second bend part are each 90° bend parts, being arranged to direct a microwave signal propagating longitudinally along the respective first and second surface-mounted waveguide parts towards the dielectric carrier material when the first and second surface-mounted waveguide parts are mounted.

3. The waveguide transition arrangement according to claim 2, wherein the first bend part and the second bend part each comprise a matching structure in the form of a corresponding transformer section.

4. The waveguide transition arrangement according to claim 3, wherein each transformer section comprise at least one step of decreased height where the respective first walls of the first and second surface-mounted waveguide parts are arranged to be reduced in height.

5. The waveguide transition arrangement according to claim 1, wherein the frame of via holes comprises at least two adjacent rows of via holes around a circumference thereof.

* * * * *